(12) United States Patent
Bondarenko

(10) Patent No.: US 9,847,286 B2
(45) Date of Patent: Dec. 19, 2017

(54) HIGH-TEMPERATURE CYCLING BGA PACKAGING

(71) Applicant: HALLIBURTON ENERGY SERVICES, INC., Houston, TX (US)

(72) Inventor: Oleg Bondarenko, Spring, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 14/781,572

(22) PCT Filed: Apr. 18, 2014

(86) PCT No.: PCT/US2014/034609
§ 371 (c)(1),
(2) Date: Sep. 30, 2015

(87) PCT Pub. No.: WO2015/160359
PCT Pub. Date: Oct. 22, 2015

(65) Prior Publication Data
US 2016/0181192 A1    Jun. 23, 2016

(51) Int. Cl.
*H01L 23/00*    (2006.01)
*H01L 23/498*    (2006.01)
(Continued)

(52) U.S. Cl.
CPC ........ *H01L 23/49838* (2013.01); *H01L 23/32* (2013.01); *H01L 23/49805* (2013.01);
(Continued)

(58) Field of Classification Search
CPC ....... H01L 23/00; H01L 23/562; H01L 24/83; H01L 23/49838; H01L 23/32;
(Continued)

(56) References Cited

U.S. PATENT DOCUMENTS 6,261,869 B1    7/2001    Radford et al.
6,869,290 B2    3/2005    Brown et al.
(Continued)

FOREIGN PATENT DOCUMENTS

JP    2003258154    9/2003
JP    2006066755    3/2006

OTHER PUBLICATIONS

PCT Search Report for PCT Application No. PCT/US2014/0346 dated Jan. 19, 2015.
(Continued)

*Primary Examiner* — Jenny L Wagner
*Assistant Examiner* — Michael P McFadden
(74) *Attorney, Agent, or Firm* — Locke Lord LLP

(57) ABSTRACT

An example method for attaching a ball grid array chip to a circuit board includes providing an adapter for attaching a chip with a plurality of solder balls to a circuit board, the adapter having an adapter substrate made from a material having substantially the same coefficient of thermal expansion as the substrate used in the chip and having at least one electrical contact site on a mounting surface of the adapter substrate for engaging a solder ball on the ball grid array chip and a plurality of lead wires extending from each side of the adapter substrate. At least one of the lead wires is electrically connected to at least one electrical contact site on the adapter substrate.

21 Claims, 3 Drawing Sheets

(51) Int. Cl.
- *H01L 23/32* (2006.01)
- *H05K 1/18* (2006.01)
- *H05K 1/14* (2006.01)
- *H05K 3/34* (2006.01)

(52) U.S. Cl.
CPC .. *H01L 23/49811* (2013.01); *H01L 23/49816* (2013.01); *H01L 23/49833* (2013.01); *H01L 23/49861* (2013.01); *H01L 24/17* (2013.01); *H01L 24/81* (2013.01); *H05K 1/141* (2013.01); *H05K 1/181* (2013.01); *H01L 2224/16055* (2013.01); *H01L 2224/16057* (2013.01); *H01L 2224/16227* (2013.01); *H01L 2224/48091* (2013.01); *H01L 2224/48227* (2013.01); *H01L 2224/81191* (2013.01); *H01L 2924/14* (2013.01); *H01L 2924/15311* (2013.01); *H01L 2924/181* (2013.01); *H01L 2924/19041* (2013.01); *H05K 3/3426* (2013.01); *H05K 3/3436* (2013.01); *H05K 2201/049* (2013.01); *H05K 2201/10015* (2013.01); *H05K 2201/10734* (2013.01)

(58) Field of Classification Search
CPC ......... H01L 23/49805; H01L 23/49816; H01L 23/49833; H01L 23/49861; H01L 24/17; H01L 24/81; H01L 2224/16055; H01L 2224/16057; H01L 2224/16227; H01L 2224/48091; H05K 1/141; H05K 1/181
USPC .................................................. 361/765, 783
See application file for complete search history.

(56) References Cited

U.S. PATENT DOCUMENTS

| | | | |
|---|---|---|---|
| 7,049,170 B2 * | 5/2006 | Savastiouk | H01L 23/13 257/E23.008 |
| 7,081,373 B2 * | 7/2006 | Roeters | H01L 23/5387 257/E23.177 |
| 7,160,119 B2 | 1/2007 | Rathburn | |
| 7,180,171 B1 | 2/2007 | Taheri | |
| 7,297,003 B2 | 11/2007 | Rathburn et al. | |
| 7,910,838 B2 | 3/2011 | Goodman | |
| 8,091,222 B2 | 1/2012 | Fedde et al. | |
| 8,310,067 B2 | 11/2012 | Zhao et al. | |
| 8,796,836 B2 * | 8/2014 | Lee | H01L 23/3121 257/668 |
| 2002/0145207 A1 | 10/2002 | Anderson et al. | |
| 2003/0111736 A1 | 6/2003 | Roeters et al. | |
| 2005/0047106 A1 | 3/2005 | Martino | |
| 2009/0152547 A1 | 6/2009 | Park et al. | |
| 2011/0069463 A1 * | 3/2011 | Chen | H05K 1/145 361/782 |
| 2011/0080717 A1 | 4/2011 | Koide et al. | |
| 2013/0266782 A1 * | 10/2013 | Moriya | H01L 23/142 428/213 |

OTHER PUBLICATIONS

PCT Written Opinion for PCT Application No. PCT/US2014/034609 dated Jan. 19, 2015.

"BGA Support Tools Product Summary Page", Freescale Semiconductor, downloaded from the internet at http://www.freescale.com/webapp/sps/site/prod_summary.jsp?code=BGA_SUPPORT, 2013.

"QFP Adapters", Advanced Interconnections, brochure downloaded from the internet at http://www.advanced.com/products/package-conversion-adapters/qfp-adapters, 2013.

Kastner, Extended European Search Report dated Aug. 17, 2017.

* cited by examiner

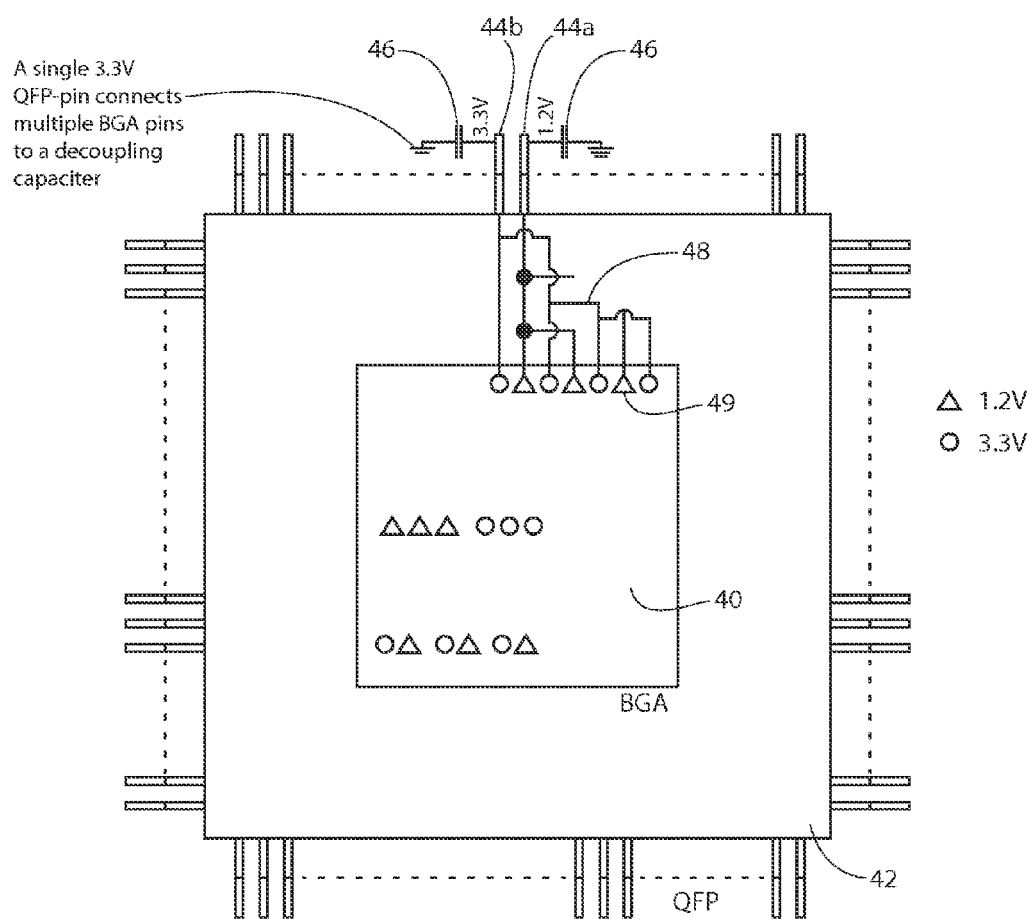

HIGH-TEMPERATURE CYCLING BGA PACKAGING

TECHNICAL FIELD

The embodiments disclosed herein relate generally to methods and systems for using integrated circuit chips in BGA packaging in high-temperature cycling conditions.

BACKGROUND

Ball grid array ("BGA") packaging is becoming increasingly popular for integrated circuit chips, such as processors ("CPUs," "MCUs"), field-programmable arrays ("FPGA") and memory chips. BGA packaging provides integrated circuits with efficient packaging and excellent high-temperature survivability. However, BGA packaging has drawbacks with respect to its use in downhole electronics in the oil and gas industry. Downhole electronics experience repeated temperature cycles between high temperatures, close to 400° F., and room temperature. These temperature cycles may quickly ruin the electronic connections between the ball grid array package and the printed circuit board ("PCB") onto which it is mounted.

BRIEF DESCRIPTION OF DRAWINGS

FIG. 4 is a diagram illustrating an adapter with an BGA chip attached according to an embodiment.

DETAILED DESCRIPTION OF DISCLOSED EMBODIMENTS

Figure 1:
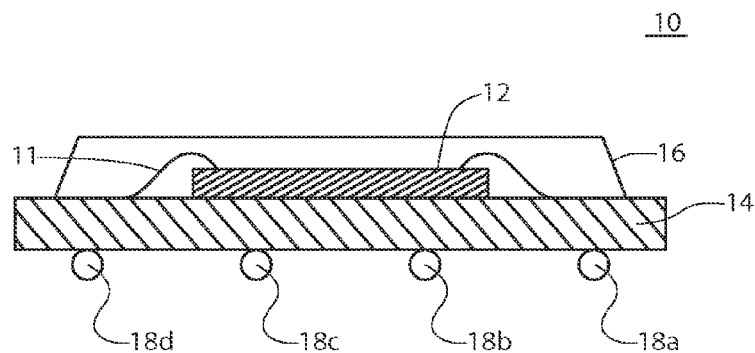
FIG. 1 is a diagram illustrating a ball grid array chip according to an embodiment.

As an initial matter, it will be appreciated that the development of an actual, real commercial application incorporating aspects of the disclosed embodiments will require many implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would nevertheless be a routine undertaking for those of skill in this art having the benefit of this disclosure.

It should also be understood that the embodiments disclosed and taught herein are susceptible to numerous and various modifications and alternative forms. Thus, the use of a singular term, such as, but not limited to, "a" and the like, is not intended as limiting of the number of items. Similarly, any relational terms, such as, but not limited to, "top," "bottom," "left," "right," "upper," "lower," "down," "up," "side," and the like, used in the written description are for clarity in specific reference to the drawings and are not intended to limit the scope of the disclosure.

Integrated circuits ("ICs") are typically put into protective packages that allow them to be assembled onto circuit boards. Numerous different types of integrated circuit packages exist. One type of package is a quad flat package ("QFP"), which is a surface-mounted integrated circuit package with electrical connecting leads extending from each of the four sides of the package. Among the IC packaging types, the QFP packaging provides excellent protection from thermal expansion effects. This is because the flexibility in the connecting leads allows them to compensate for differences between the coefficient of thermal expansion ("CTE") between the QFP package and the printed circuit board to which it is mounted.

Ball grid array ("BGA") packaging is based on an array of solder balls distributed on the "bottom" of a substrate having an integrated circuit chip mounted on the opposite surface. BGA packaging, however, suffers from drawbacks when used in oilfield Downhole tool applications that experience high temperature cycling. In a BGA package, the solder balls are tightly attached, both to the circuit board surface and the chip surface. During thermal expansion, the solder balls are increasingly placed under mechanical stress caused by the difference between thermal expansion coefficients of the circuit board and the BGA chip substrate. This results in cracks and critical damage to the ball grid array chip.

In QFP packaging, however, the contact between the chip and the PCB traces is provided by pins that serve as an efficient strain relief tool. The mechanical stress simply leads to the deformation of the pin without damaging the chip body. Embodiments of this disclosure provide an apparatus and method for integrated circuit packaging using the QFP footprint. In one version, an adapter is provided that matches the coefficient of thermal expansion between a BGA chip and a QFP chip adapter so that chips using BGA packaging may be successfully and reliably deployed in downhole operations that demand repeated temperature cycling of the onboard electronics. In one particular embodiment, the disclosure provides a ball grid array to the QFP adapter built of the same material as the chip body.

FIG. 1 is a cross-sectional view of a BGA chip useful in an embodiment. The BGA chip 10 includes an integrated circuit 12 mounted to a substrate 14. Example substrates include laminated plastic material, though ceramic or other materials may be used as well. The integrated circuit 12 is sealed with an mold compound material 16 to protect the integrated circuit 12 from damage. Conductive bond wires 11 connect the operative circuits on the integrated circuit 12 to conductive traces on the on the substrate 14. On the opposite side of substrate 14 are a plurality of solder balls 18a-18d. Only four solder balls are shown for clarity, but the chip 10 is not limited to only four solder balls. Each of the solder balls 18a-18d is arranged on a conductive pad on the substrate 14 and electrically connected to corresponding conductive bond wires 11 to allow electrical communication between the solder balls 18a-18d and the integrated circuit 12.

In conventional assembly, the BGA chip may be placed on a circuit board having conductive pads arranged in a pattern matching the pattern of solder balls on the "bottom," or mounting side of the BGA package. The BGA chip/circuit board assembly may then be heated, for example, in a reflow oven or by an infrared heater, which melts the solder balls and creates a soldered connection between the BGA chip and the circuit board. Once assembled, however, the solder balls cannot flex like the longer leads of a QFP package. Because they are not as mechanically compliant, bending due to a difference in coefficient of thermal expansion between the BGA chip and the circuit board can cause the solder joints to fail. This problem is exacerbated in downhole tool applications where the circuit board may experience repeated temperature cycles over a range of 200° F., or more.

Figure 2A:
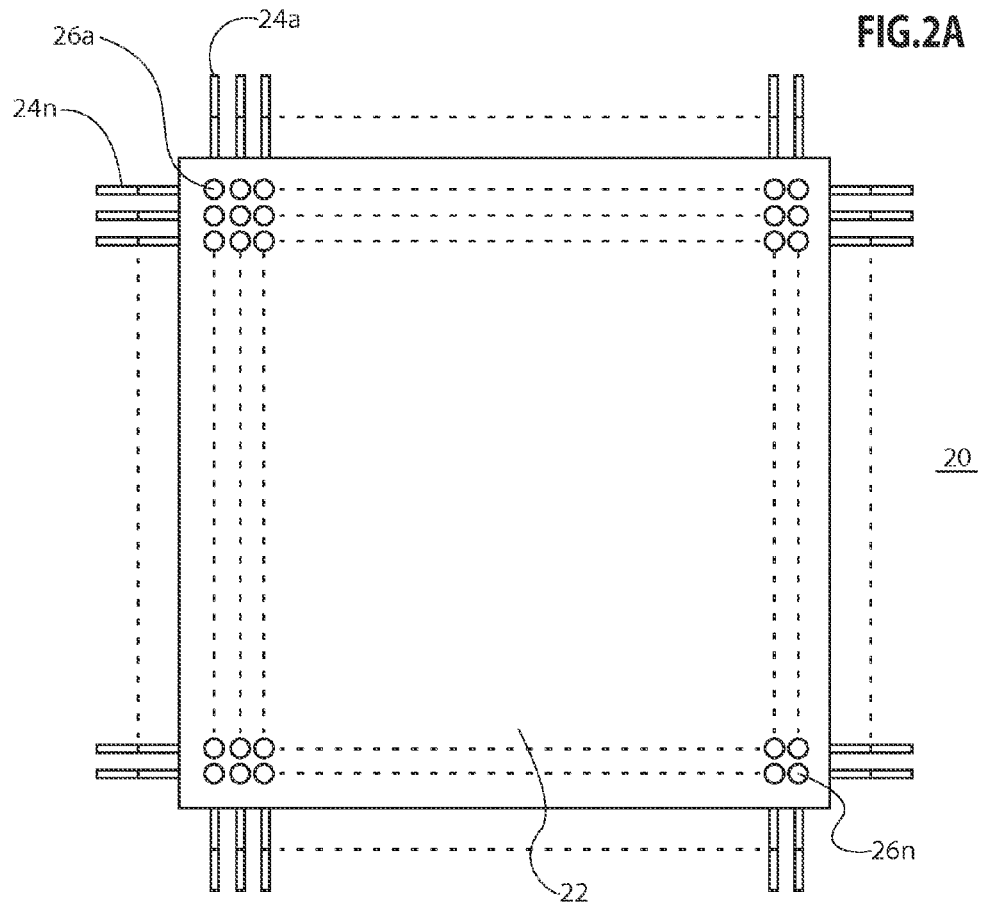
FIG. 2A is a diagram illustrating an adapter according to an embodiment.
Figure 2B:
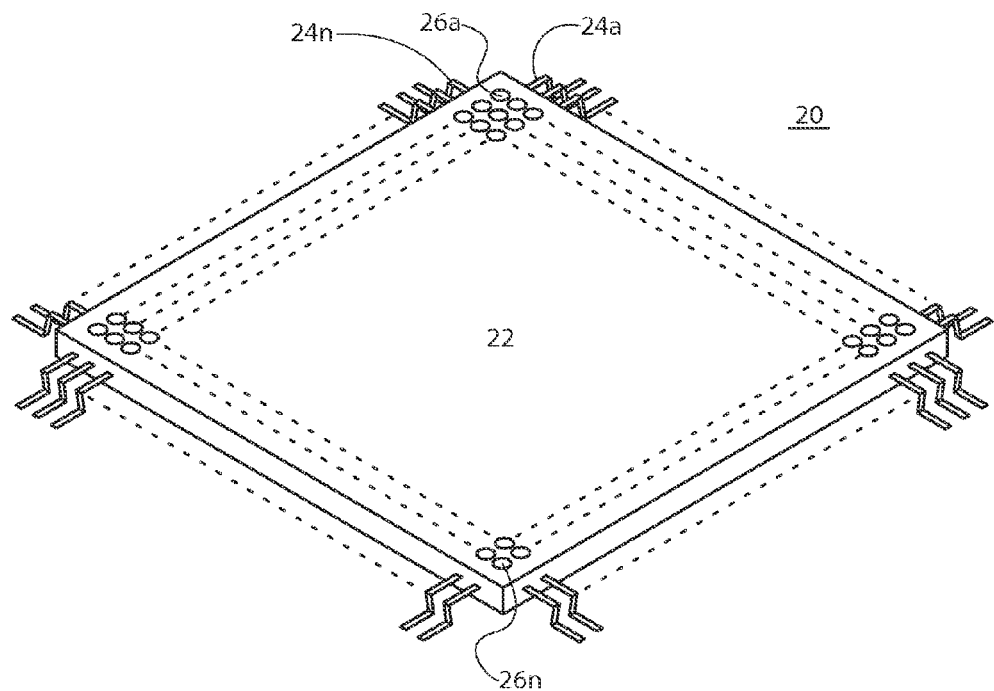
FIG. 2B is a diagram illustrating an adapter according to an embodiment.

FIGS. 2A-2B depict an adapter according to an embodiment of the disclosure. FIG. 2A is a top view of the embodiment, and FIG. 2B is a plan view of the embodiment depicted in FIG. 2A. The adapter 20 comprises a substrate 22 made from a material having substantially the same coefficient of thermal expansion as the substrate used in the BGA chip. Using the same material, or, alternatively, a material with substantially the same coefficient of thermal expansion, will reduce or eliminate undesired bending between the BGA chip and the adapter 20 as the assembly experiences thermal cycles during use. The conductive leads $24a$-$24n$ of the adapter 20, according to an embodiment, may be constructed and arranged according to a standard QFP footprint, in which conductive leads $24a$-$24n$ extend outwardly from each of the four sides of the adapter 20, and have a conventional "gull wing" profile shown in FIG. 2B.

The "top" surface of the adapter 20, i.e., the surface that the BGA chip is mounted to, has a plurality of conductive pads $26a$-$26n$ that provide electrical attachment sites for the solder balls of the BGA chip. Conductive pads $26a$-$26n$ are electrically connected to conductive leads $24a$-$24n$ through wire traces or vias in the substrate 22 of adapter 20. The wiring layout that determines which of the conductive leads $24a$-$24n$ are electrically connected to which of the conductive pads $26a$-$26n$ is a matter of design choice. The number of pins present in the BGA chip does necessarily match the number of conductive leads available in the QFP adapter 20. Rather, the pin density in a BGA package may exceed the pin density in a QFP package, and some pins in the BGA chip will be unused or intentionally shorted or grounded. There may be groups of pins that are critically important and should be connected to the board circuitry, like power, ground, programming inputs, clock inputs, and so forth. However, there also may be groups of pins that are optional, like parallel ports, analog ports, and communications ports that do not need to necessarily have associated pins in the QFP adapter 20.

More specifically, a typical BGA package may have from 256 to 1152 pins. QFP packaging, however, is typically limited to a range from 16 to 208 pins, though some versions can support a somewhat higher pin count. For example, in an implementation in which a 484-pin BGA is to be coupled to a 176-pin adapter, the adapter traces must be configured to compensate for the reduced pin set. In a typical FPGA in BGA-484 pin packaging, up to 240 pins may be used as functional input/output ("IO") pins. The remaining pins will be multiple ground pins, 1.2V pins, 3.3V pins, and so forth. The adapter may be provided with conductive traces to electrically connect these ground pins and pins having the same power lever to reduce the pin count. In other implementations, some pins may be provided with decoupling capacitors on a one pin per capacitor basis. The adapter may be provided with capacitors installed on the adapter, allowing the adapter to have a small footprint, or may be incorporated into the adapter substrate directly. In still other embodiments, power pins with similar voltages may be combined into groups, particularly if they are physically close to each other, and provided with a single capacitor.

FIG. 4 shows an embodiment of the disclosure having a BGA chip 40 mounted to an adapter 42 having a QFP footprint. The adapter 42 includes a plurality of conductive leads that electrically couple to the solder balls on the BGA chip 40 through conductive traces, such as traces 48, in the adapter 42. In the implementation shown, the BGA chip has a plurality of power pins, in which circular icons represent 3.3V pins and triangular icons represent 1.2V pins. These pins are coupled through traces 48 to leads $44a$ and $44b$, respectively. It will be appreciated from the figure that the 1.2V pins are coupled together and the 3.3V pins are coupled together through traces 48 so that the number of conductive leads required by the QFP adapter is reduced to one for each voltage level, and only a single coupling capacitor 46 is also used for each voltage level. Of course, in some implementations it may not be desirable to connect all pins having the same voltage level, especially if they far apart physically. Therefore, it may be desirable to couple the pins in groups.

Figure 3:
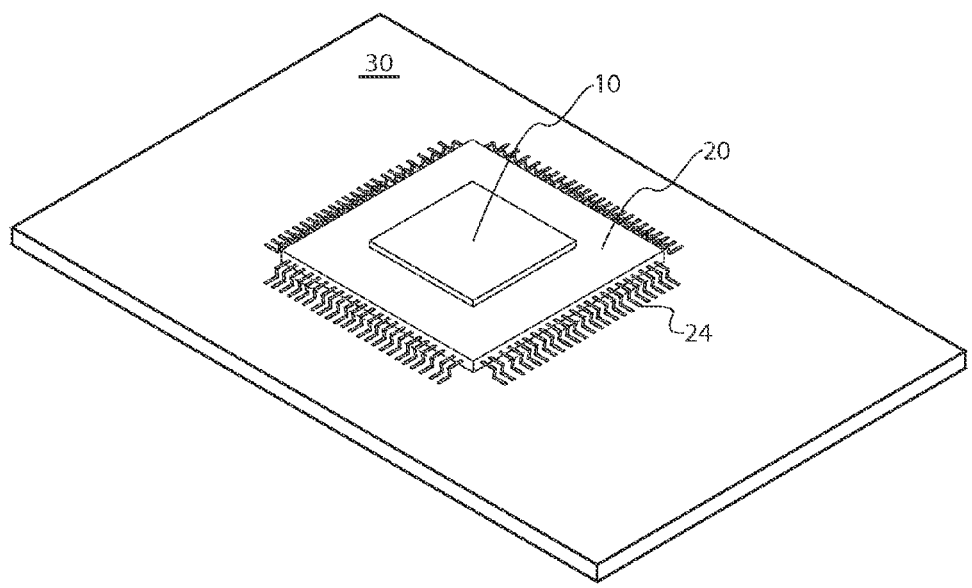
FIG. 3 is a diagram illustrating a circuit board with an adapter having a QFP footprint mounted on it according to an embodiment.

Referring again to FIGS. 2A, 2B, and 3, the BGA chip may then be soldered to the top surface of the BGA-to-QFP adapter 20 using conventional BGA soldering techniques which will be known to those of skill in the art. The adapter 20 may then be attached to a QFP footprint on the circuit board according to conventional surface mount techniques. In other embodiments, the adapter 20 may be socket mounted to the circuit board. In still further embodiments, the adapter 20 may first be attached to the circuit board and then the BGA chip may be soldered to the adapter 20. When the circuit board experiences thermal cycling, the QFP-style leads $24a$-$24n$ on adapter 20 will take the mechanical stress coming from the difference in thermal expansion coefficients while the ball grid array will remain unstressed. Further, the mechanical flexibility in the leads $24a$-$24n$ will also help absorb other mechanical stresses caused by, for example, vibration. FIG. 3 shows a plan view of a circuit board 30 having an adapter 20 with a QFP foot print surface mounted to it. The adapter leads are electrically connected, for example by soldering, to conductive pads on the circuit board 30. The BGA chip 10 is mounted to the "top" or mounting surface of the adapter 20 through the solder balls on the BGA chip (not shown in FIG. 3.)

Another embodiment provides an adapter for attaching a ball grid array chip to a circuit board. The adapter includes an adapter substrate having substantially the same coefficient of thermal expansion as the substrate used in the ball grid array chip. Any differences in the coefficient of thermal expansion between the substrate materials should be small enough that no damage will occur to the BGA/adapter connection over the temperature range that the combined assembly is expected to cycle through. In general, the higher the temperature at which the adapter is to be used, the more significant the effects of any CTE mismatch between the adapter and the chip will be. Nevertheless, even with CTE differences between the adapter and the chip, the adapter will survive some number of cycles before the damage becomes critical. Therefore, the CTEs of the substrates for the adapter and the chip may be considered substantially the same if the CTE difference does not result in significant damage over the maximum allowed number of thermal cycles within the expected temperature range of operation. For example, electronics using BGA chips are often certified for operation between 0 and +70 C. A chip housing may use a molding compound with a CTE of about 3 ppm. The difference in expansion of the chip and the board pattern it is soldered to is (12 [ppm/C]−3 [ppm/C])*70 C=630 ppm. The desired CTE for a silicon chip able to safely thermocycle in the range −40 C to +175 C may be determined as follows. Letting "x" represent the desired CTE, the temperature range becomes 175 C−(−40 C)=215 C. The mechanical expansion should not exceed 630 ppm, so (x−3)*215=630 ppm. Solving for x yields x=6 ppm. This would represent a safe value for the CTE of the surface where a chip is soldered. These results may be extrapolated for higher temperatures using the Arrhenius equation, which generally contemplates that with increasing temperature the effect of CTE differences between the QFP and BGA will also increase. Therefore, for temperature operation in the range of −40 C to +175 C, the a chip substrate having a CTE of 6 ppm would be substantially the same as an adapter substrate CTE of 3 ppm in this example. In some implementations, it may also be important to consider the effect of vibration. For example, mechanical vibrations may reduce the life of the connections by a factor of 3 or more, and may require an even closer CTE match. In one version, the adapter substrate is made from the same material as the BGA substrate.

The coefficient of thermal expansions may be matched in various ways. For example, the substrate material for the adapter may be obtained directly from the supplier of the BGA chip or substrate, or the same brand and model of material may be used. Alternately, the thermal expansion coefficient may be measured by heating the desired BGA chip through various temperatures and measuring the dimensional changes. Normally, the coefficient is an isotropic linear value.

The adapter also has least one electrical contact site on the "top" or BGA mounting surface of the adapter substrate for engaging a solder ball on the ball grid array chip to provide electrical communication to an integrated circuit packaged in the ball grid array chip. A plurality of lead wires extends from each side of the adapter substrate in a QFP arrangement, wherein at least one of the lead wires is electrically connected to at least one electrical contact site on the adapter substrate. The lead wires may be provided with the conventional "gull-wing" shape for QFP leads.

One or more methods for attaching a ball grid array chip to a circuit board may include providing an adapter for attaching a ball grid array chip to a circuit board, the adapter having an adapter substrate made from a material having substantially the same coefficient of thermal expansion as the substrate used in the ball grid array chip and having at least one electrical contact site on a mounting surface of the adapter substrate for engaging a solder ball on the ball grid array chip to provide electrical communication to an integrated circuit packaged in the ball grid array chip, and a plurality of lead wires extending from each side of the adapter substrate in a QFP arrangement, wherein at least one of the lead wires is electrically connected to at least one electrical contact site on the adapter substrate. The method also includes attaching the ball grid array chip to the adapter, and attaching the adapter to the circuit board. Attaching the BGA chip to the adapter and attaching the adapter to the circuit board may be performed according to conventional soldering and surface mount techniques.

In one or more embodiments, a circuit board may be provided having a ball grid array that includes an integrated circuit and a substrate with a plurality of solder balls electrically connected to the integrated circuit. An adapter is provided for attaching the ball grid array chip to the circuit board, the adapter includes an adapter substrate made from a material having substantially the same coefficient of thermal expansion as the ball grid array chip substrate, wherein the adapter includes at least one electrical contact site on a mounting surface of the adapter substrate electrically coupled to a solder ball on the ball grid array chip substrate. The adapter also includes a plurality of lead wires extending from each side of the adapter substrate in a QFP arrangement, wherein at least one of the lead wires is electrically connected to at least one electrical contact site on the adapter substrate. In this implementation, the circuit board includes a plurality of conductive traces on the circuit board that are electrically connected to the plurality of lead wires on the adapter.

While the disclosed embodiments have been described with reference to one or more particular implementations, those skilled in the art will recognize that many changes may be made thereto without departing from the spirit and scope of the description. Accordingly, each of these embodiments and obvious variations thereof is contemplated as falling within the spirit and scope of the following claims.

What is claimed is:

1. A method for attaching a chip having a plurality of solder balls to a circuit board, comprising:
providing an adapter for attaching the chip to a circuit board, the chip having a substrate made from a plastic or ceramic material, the adapter having an adapter substrate made from a material having substantially the same coefficient of thermal expansion as the substrate used in the chip and having at least one electrical contact site on a mounting surface of the adapter substrate for engaging a solder ball on the chip, and a plurality of lead wires extending from each side of the adapter substrate, wherein at least one of the lead wires is electrically connected to at least one electrical contact site on the adapter substrate;
attaching the chip to the adapter; and
attaching the adapter to the circuit board;
wherein the material from which the adapter substrate is made is selected such that a difference between the coefficient of thermal expansion of the substrate of the chip and the coefficient of thermal expansion of the adapter substrate multiplied by a downhole operating temperature range is 630 ppm or less, the downhole operating temperature range being a difference between a minimum and a maximum downhole operating temperature.

2. A method as in claim 1, wherein providing an adapter for attaching the chip includes providing an adapter having a substrate made from the same material as the chip substrate.

3. A method as in claim 1, wherein the downhole operating temperature range is about 225° Celsius.

4. A method as in claim 1, wherein conductive traces on the adapter representing at least two pins having the same power level are electrically connected together.

5. A method as in claim 1, wherein providing an adapter comprises providing an adapter having decoupling capacitors on a one pin per capacitor basis.

6. A method as in claim 1, wherein providing an adapter comprises providing an adapter having capacitors installed on the adapter.

7. A method as in claim 1, wherein providing an adapter comprises providing an adapter with at least one capacitor incorporated directly into the adapter substrate.

8. A method as in claim 1, wherein each of the coefficient of thermal expansion of the substrate of the chip and the coefficient of thermal expansion of the adapter substrate is obtained by one of: measuring the coefficient of thermal expansion, or using a supplier-provided coefficient of thermal expansion.

9. An adapter for attaching a chip having a plurality of solder balls to a circuit board, comprising:
an adapter substrate having substantially the same coefficient of thermal expansion as a substrate used in the chip, the substrate being made from a plastic or ceramic material;

at least one electrical contact site on a mounting surface of the adapter substrate for engaging a solder ball on the chip;

a plurality of lead wires extending from each side of the adapter substrate, wherein at least one of the lead wires is electrically connected to at least one electrical contact site on the adapter substrate; and wherein the material from which the adapter substrate is made is selected such that a difference between the coefficient of thermal expansion of the substrate of the chip and the coefficient of thermal expansion of the adapter substrate multiplied by a downhole operating temperature range is 630 ppm or less, the downhole operating temperature range being a difference between a minimum and a maximum downhole operating temperature.

10. An adapter as in claim 9, wherein the adapter substrate is made from the same material as the chip substrate.

11. An adapter as in claim 9, wherein the downhole operating temperature range is about 225° Celsius.

12. An adapter as in claim 9, wherein conductive traces on the adapter representing at least two pins having the same power level are electrically connected together.

13. An adapter as in claim 9, further comprising decoupling capacitors on a one pin per capacitor basis.

14. An adapter as in claim 9, further comprising capacitors installed on the adapter.

15. An adapter as in claim 9, further comprising at least one capacitor incorporated directly into the adapter substrate.

16. A circuit board comprising:

a chip having an integrated circuit and a substrate with a plurality of solder balls electrically connected to the integrated circuit, the substrate being made from a plastic or ceramic material;

an adapter including an adapter substrate made from a material having substantially the same coefficient of thermal expansion as the chip substrate, wherein the adapter includes at least one electrical contact site on a mounting surface of the adapter substrate electrically coupled to a solder ball on the chip substrate; and a plurality of lead wires extending from each side of the adapter substrate, wherein at least one of the lead wires is electrically connected to at least one electrical contact site on the adapter substrate;

a plurality of conductive traces on the circuit board that are electrically connected to the plurality of lead wires;

wherein the material from which the adapter substrate is made is selected such that a difference between the coefficient of thermal expansion of the substrate of the chip and the coefficient of thermal expansion of the adapter substrate multiplied by a downhole operating temperature range is 630 ppm or less, the downhole operating temperature range being a difference between a minimum and a maximum downhole operating temperature.

17. A circuit board as in claim 16, wherein the adapter substrate is made from the same material as the chip substrate.

18. A circuit board as in claim 16, wherein the downhole operating temperature range is about 225° Celsius.

19. A circuit board as in claim 16, wherein conductive traces on the adapter representing at least two pins having the same power level are electrically connected together and has a plurality of decoupling capacitors on a one pin per capacitor basis.

20. A circuit board as in claim 16, further comprising capacitors installed on the adapter.

21. A circuit board as in claim 16, further comprising at least one capacitor incorporated directly into the adapter substrate.

* * * * *